United States Patent
Son et al.

(10) Patent No.: US 11,864,463 B2
(45) Date of Patent: Jan. 2, 2024

(54) PREPARATION METHOD OF A STRETCHABLE INORGANIC THERMOELECTRIC THIN FILM AND THE STRETCHABLE INORGANIC THERMOELECTRIC THIN FILM PREPARED BY THE SAME

(71) Applicant: UNIST(ULSAN NATIONAL INSTITUTE OF SCIENCE AND TECHNOLOGY), Ulsan (KR)

(72) Inventors: Jae Sung Son, Ulsan (KR); Seung Hwae Heo, Ulsan (KR); Moon Kee Choi, Ulsan (KR); Jisu Yoo, Ulsan (KR)

(73) Assignee: UNIST(ULSAN NATIONAL INSTITUTE OF SCIENCE AND TECHNOLOGY), Ulsan (KR)

(*) Notice: Subject to any disclaimer, the term of this patent is extended or adjusted under 35 U.S.C. 154(b) by 0 days.

(21) Appl. No.: 17/971,813

(22) Filed: Oct. 24, 2022

(65) Prior Publication Data
US 2023/0172067 A1   Jun. 1, 2023

(30) Foreign Application Priority Data
Aug. 19, 2022  (KR) .................. 10-2022-0103706

(51) Int. Cl.
*H10N 10/01*  (2023.01)
*H10N 10/00*  (2023.01)
*C01B 19/00*  (2006.01)
*H10N 10/852*  (2023.01)

(52) U.S. Cl.
CPC ........... *H10N 10/00* (2023.02); *C01B 19/002* (2013.01); *H10N 10/852* (2023.02); *C01P 2002/50* (2013.01); *C01P 2002/72* (2013.01); *C01P 2004/03* (2013.01); *C01P 2006/32* (2013.01); *C01P 2006/40* (2013.01)

(58) Field of Classification Search
CPC ..... H10N 10/01; H10N 10/852; C01B 19/002
See application file for complete search history.

(56) References Cited

FOREIGN PATENT DOCUMENTS

KR            102198316 B1         1/2021

OTHER PUBLICATIONS

Chien et al., "Facile chemical synthesis and enhanced thermoelectric properties of Ag doped SnSe nanocrystals", RSC Adv., 2017, 7, 34300. (Year: 2017).*

* cited by examiner

*Primary Examiner* — Tae-Sik Kang
(74) *Attorney, Agent, or Firm* — Fredrikson & Byron, P.A.

(57) ABSTRACT

The present invention relates to a preparation method of a stretchable inorganic thermoelectric thin film and the stretchable inorganic thermoelectric thin film prepared by the method.

10 Claims, 10 Drawing Sheets

PREPARATION METHOD OF A STRETCHABLE INORGANIC THERMOELECTRIC THIN FILM AND THE STRETCHABLE INORGANIC THERMOELECTRIC THIN FILM PREPARED BY THE SAME

CROSS-REFERENCES TO RELATED APPLICATION

This patent application claims the benefit of priority under 35 U.S.C. § 119 from Korean Patent Application 10-2021-0168296 filed on Nov. 30, 2021 and Korean Patent Application 10-2022-0103706 filed on Aug. 19, 2022 the contents of which are incorporated herein by reference.

BACKGROUND OF THE INVENTION

1. Field of the Invention

The present invention relates to a preparation method of a stretchable inorganic thermoelectric thin film and the stretchable inorganic thermoelectric thin film prepared by the method.

2. Description of the Related Art

As technologies such as personal area network, body sensor network, ambient intelligence, lab-on-a-chip, and wearable devices develop, the demand for technologies that generate and supply electric energy to a system by itself without needing to be connected to a power grid is also increasing. Since the thermoelectric generator has the characteristic of collecting waste heat generated from electronic devices and effectively converting it into electrical energy, it is in the spotlight as a strong candidate applicable to the aforementioned various fields. In particular, a thin film type thermoelectric generator is easy to miniaturize, so it can be easily combined with microscale electronic devices, and has the advantage of excellent durability against mechanical deformation. Therefore, if an excellent thin-film generator is developed, its ripple effect is expected to be significant.

Existing thermoelectric generators were manufactured using a method of assembling a large-scale bulk thermoelectric material after cutting it into mm or cm-sized rectangular parallelepiped legs. Therefore, the shape of the generator is not flexible and has a problem in that it is difficult to connect to a microscale electronic device. On the other hand, the thin film manufacturing process using the vapor deposition process has a limitation in that the production cost of the material is high and mass production is difficult. In addition, the process using organic material-based ink has problems in that it has significantly lower thermoelectric properties and poor stability at high temperatures compared to existing inorganic materials.

In this regard, Korean Patent No. 10-2198396 discloses a stretchable display and a manufacturing method thereof, and specifically discloses manufacturing method comprising a step of forming a graphene layer in a state in which a film is stretched. However, since the method is not a technique of using an inorganic thermoelectric material and not a technique of forming a pattern on thermoelectric material, it is difficult to apply the method to an inorganic thermoelectric material as it is.

Accordingly, the present inventors completed the present invention by researching a method of manufacturing a stretchable inorganic thermoelectric thin film having excellent durability in relation to thermoelectric properties while having elasticity in manufacturing a thermoelectric device using an inorganic thermoelectric material.

SUMMARY OF THE INVENTION

It is an object of the present invention to provide a preparation method or a stretchable inorganic thermoelectric thin film and the stretchable inorganic thermoelectric thin film prepared and thermoelectric by the same.

To achieve the above object, the present invention provides a preparation method of a stretchable inorganic thermoelectric thin film comprising the following steps:

synthesizing $Ag_xSn_{1-x}Se$ solution (where X is a decimal number greater than 0 and less than 1) by a solution process;

forming a thermoelectric thin film by coating the $Ag_xSn_{1-x}Se$ solution on a substrate;

forming physically separated pattern on the thermoelectric thin film;

forming a patterned thermoelectric thin film by electrically connecting each pattern;

encapsulating the patterned thermoelectric thin film;

transferring the encapsulated patterned thermoelectric thin film to an elongated stretchable substrate; and removing the tensile force from the elongated stretchable substrate.

In addition, the present invention provides an inorganic thermoelectric thin film having wrinkles on the surface and having elasticity prepared by the above method.

Advantageous Effect

According to the preparation method of the present invention, it is possible prepare an inorganic thermoelectric thin film having stretchability and flexibility, and as the crystal orientation is improved by preparing the thermoelectric thin film by a solution process, cracks are suppressed when the thin film is stretched. Also, there is an effect of suppressing degradation of thermoelectric properties even in the stretching process.

BRIEF DESCRIPTION OF THE DRAWINGS

FIG. 7A is a resistance-strain graph, FIG. 7B is a power-strain graph, FIG. 7C is a resistance-strain cycle graph and FIG. 7D is a power-strain cycle graph.

DESCRIPTION OF THE PREFERRED EMBODIMENTS

Figure 1A:
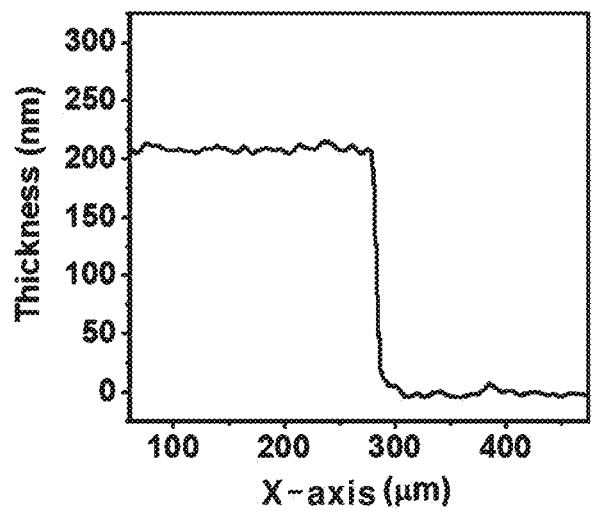
FIG. 1A is a surface propile of the thermoelectric thin film prepared according to the present invention obtained through interferometric scattering microscope photograph.

In the present invention, '$Ag_xSn_{1-x}Se$' refers to tin-selenide (SnSe) doped with silver (Ag).

The present invention provides a preparation method of a stretchable inorganic thermoelectric thin film, and specifically provides a preparation method of a stretchable inorganic thermoelectric thin film comprising the following steps:

synthesizing $Ag_xSn_{1-x}Se$ solution (where X is a decimal number greater than 0 and less than 1) by a solution process;

forming a thermoelectric thin film by coating the $Ag_xSn_{1-x}Se$ solution on a substrate;

forming a physically separated pattern on the thermoelectric thin film;

forming a patterned thermoelectric thin film by electrically connecting each pattern;

encapsulating the patterned thermoelectric thin film;

transferring the encapsulated patterned thermoelectric thin film to an elongated stretchable substrate; and removing the tensile force from the elongated stretchable substrate.

Hereinafter, the preparation method of the present invention is described in detail in each step.

The preparation method of the present invention includes a step of synthesizing $Ag_xSn_{1-x}Se$ solution (where X is a decimal number greater than 0 and less than 1) by a solution process. The $Ag_xSn_{1-x}Se$ solution is a solution for a material having thermoelectric properties, and by being prepared through a solution process, crystal orientation is improved. Therefore, in the case of preparing stretchable inorganic thermoelectric thin film using this solution, there is an effect of improving durability by suppressing the possibility of cracks occurring in the thermoelectric material during the stretching process. In addition, there is an advantage in that the crystal orientation is further improved by doping Ag into SnSe.

Specifically, the solution process can be performed by various methods, but may be performed by mixing and reacting SnSe solution and $Ag_2Se$ solution, and each SnSe solution and Ag2Se solution can be prepared, for example, by Alkahest solvent method. More specifically, the SnSe solution can be prepared by adding 1.8 ml of ethylenediamine and 0.18 ml of ethanedithiol to a mixture of 90 mg of Sn powder and 60 mg of Se powder, and then reacting at 50° C. for 1 hour. The $Ag_2Se$ solution can be prepared by adding 0.9 ml of ethylenediamine and 0.09 ml of ethanedithiol to 15.6 mg of $Ag_2S$ powder and 10 mg of Se powder, respectively, and then mixing in a volume ratio of 1:4.

The preparation method of the present invention includes a step of forming a thermoelectric thin film by coating the $Ag_xSn_{1-x}Se$ solution on a substrate. At this time, the substrate can be a glass substrate, and If it is a substrate from which the thermoelectric thin film can be easily peeled off later without contaminating the thermoelectric thin film inorganic later, it is not necessarily limited to the glass substrate.

On the other hand, it is preferred that the preparation method of this invention further includes a step of forming a hydrophilic functional group on the surface of the substrate before coating the $Ag_xSn_{1-x}Se$ solution on the substrate. By forming a hydrophilic functional group on the surface of the substrate, the $Ag_xSn_{1-x}Se$ solution is uniformly deposited to the surface of the substrate, so that the thickness and composition of the thin film can be uniformly controlled after heat treatment. In addition, when preparing a stretchable inorganic thermoelectric thin film using this method, there is an advantage in that the material is not damaged locally and has excellent mechanical properties.

The step of forming the hydrophilic functional group on the surface of the substrate as described above can include a step of washing the substrate and performing $O_2$ plasma treatment.

In the preparation method of the present invention, the step of coating the $Ag_xSn_{1-x}Se$ solution on the substrate to form a thermoelectric thin film can include a step of spin-coating the $Ag_xSn_{1-x}Se$ solution on the substrate and then heating the substrate. At this time, spin coating can be performed at 2000 rpm for 40 seconds, and heating can be performed by heating at 80° C. for 5 minutes and then heating at 500° C. for 1 minute.

Next, the preparation method of the present invention includes a step of forming a physically separated pattern on the thermoelectric thin film. By forming a physically separated pattern on the thermoelectric thin film, elasticity and flexibility are imparted to the inorganic thermoelectric thin film. At this time, the step of forming a physically separated pattern on the thermoelectric thin film can include a step of spin-coating a photoresist on the thermoelectric thin film; a step of forming a physically separated pattern by exposing it to patterned ultraviolet light; a step of performing etching on the exposed thin film surface; and a step of removing the remaining photoresist. Alternatively, it can be performed by another method, but it is preferably performed by the method described above for precise patterning formation.

When the above steps are performed, physically separated patterns of inorganic thermoelectric materials are formed on the substrate, but since each pattern is physically separated, it is necessary to electrically connect them.

The preparation method of the present invention includes a step of forming a patterned thermoelectric thin film by electrically connecting each of the formed patterns. By electrically connecting each pattern in a configuration that generates electricity from applied heat, it is possible to form a thermoelectric thin film that generates electricity from heat.

At this time, the step of forming a patterned thermoelectric thin film by electrically connecting each of the formed patterns can be performed, for example, by depositing Ag electrodes and electrically connecting the respective patterns to each other.

The patterned thermoelectric thin film formed through the above steps needs a step of encapsulating the thermoelectric thin film to protect the thermoelectric thin film from exposure or damage by an external environment. To this end, the present invention includes a step of encapsulating the thermoelectric thin film patterned through the above steps.

The step of encapsulating the patterned thermoelectric thin film is a step of sealing both surfaces of the patterned thermoelectric thin film and can be performed including the following steps:

coating the upper surface of the patterned thermoelectric thin film with a polymer for encapsulation;

separating the patterned thermoelectric thin film coated with a polymer for encapsulation from the substrate;

transferring the patterned thermoelectric thin film to the substrate coated with the polymer for encapsulation, so that the encapsulating polymer-coated surface of the substrate is in contact with the lower surface of the separated patterned thermoelectric thin film; and removing the patterned thermoelectric thin film in which the upper and lower surfaces are encapsulated from the substrate.

Specifically, a polymer for encapsulation is coated on the upper surface of the patterned thermoelectric thin film formed on the substrate, and the thin film is separated from the substrate. In this state, the upper surface of the patterned thermoelectric thin film is coated with a polymer for encapsulation, and the lower surface thereof is exposed. The patterned thermoelectric thin film is then transferred to the substrate coated with the polymer for encapsulation, so that the encapsulating polymer-coated surface of the substrate is in contact with the lower surface of the separated patterned thermoelectric thin film. In this state, the patterned thermoelectric thin film is attached to the substrate with both sides sealed. Finally, the patterned thermoelectric thin film with the upper and lower surfaces sealed is removed from the substrate to obtain a patterned thermoelectric thin film with both sides sealed.

At this time, the polymer for encapsulation may vary depending on the purpose or function, but it is preferable to use polyimide in consideration of elasticity and sealing performance.

Among the above steps, the step of removing the patterned thermoelectric thin film in which the upper and lower surfaces are encapsulated from the substrate can be performed in various ways, for example, it can be carried out by attaching a water-soluble tape to the polymer surface of the encapsulated patterned thermoelectric thin film, and separating the encapsulated thermoelectric thin film from the substrate by applying force. When the step is performed in this way, it is preferable because not only the encapsulated thin film can be separated from the substrate by a simple method, but also the tape attached for separation can be removed by a simple method.

The preparation method of a stretchable inorganic thermoelectric thin film of the present invention includes a step of transferring the patterned thermoelectric thin film encapsulated through the above step to an elongated stretchable substrate. The step is a step of transferring the encapsulated patterned thermoelectric thin film prepared by the above step to the stretchable substrate in an elongated state by applying force to the stretchable substrate. Through this, in a later step, wrinkles are formed on the surface by removing the stretching force applied to the substrate, and thus it is possible to have additional elasticity.

The preparation method of the present invention includes a step of removing the stretching force from the elongated stretchable substrate after transferring the patterned thermoelectric thin film. Through this step, the stretchable substrate returns to its original state, and wrinkles are formed on the surface of the patterned thermoelectric thin film transferred thereon. At this time, since the thermoelectric thin film is a patterned thermoelectric thin film that is physically separated from each other, even if wrinkles are formed on the surface of the thin film, the possibility of cracks occurring at this time is greatly reduced. Furthermore, in the preparation method of the present invention, since the $Ag_xSn1-xSe$ material forming the thermoelectric thin film is manufactured by a solution process, crystal orientation is improved during the synthesis process, and thus, wrinkles are formed in the above step, or when stretched again after that, there is an advantage in that the possibility of cracks occurring in the thermoelectric material itself is greatly reduced.

The preparation method of the present invention provides a preparation method of a stretchable inorganic thermoelectric thin film. Since cracks are easily generated in the inorganic thermoelectric material, it is not easy to manufacture a stretchable thermoelectric thin film. According to the preparation method of the present invention, $Ag_xSn1-xSe$ material, which is a thermoelectric material, is manufactured by a solution process, and also by forming a thermoelectric material pattern that is physically spaced apart from each other in the process of manufacturing the thermoelectric thin film, so even when wrinkles are formed on the surface or during additional expansion and contraction process, it is possible to suppress the occurrence of cracks in the thermoelectric material as much as possible. Therefore, the preparation method of the present invention has an advantage in that it is possible to manufacture an inorganic thermoelectric thin film having elasticity and durability.

In addition, the present invention provides an inorganic thermoelectric thin film that is prepared by the above method, has wrinkles on the surface, and has elasticity. Since the inorganic thermoelectric thin film of the present invention is prepared by the method of the present invention as described above, the crystal orientation of the thermoelectric material is improved, and also, due to having a pattern physically separated from each other, the possibility of cracks occurring in the thermoelectric material is greatly reduced even when the process of stretching and re-contracting is repeated as well as a state in which wrinkles are formed on the surface, and thus the durability of the stretchable thermoelectric thin film is greatly improved.

Hereinafter, the present invention will be described in detail by the following examples, comparative examples and experimental examples. However, the following examples, comparative examples and experimental examples are only intended to explain the present invention in more detail, and it is not intended that the scope of the present invention is limited and interpreted by the following description.

<Materials>

Sn powder (99.8%, ~325 mesh): purchased from Akros Organics.

Se powder (99.999%, ~200 mesh): purchased from Alfa Aesar.

silver sulphite (99.9%), ethanedithiol (≥98%), ethanethiol (97%), ethylenediamine (≥99.5%), and acetonitrile (>99.8%): purchased from Sigma Aldrich Chemical Co.

<Synthesis of $Ag_xSn_{1-x}Se$ Solution>

The $Ag_xSn_{1-x}Se$ solution was synthesized by mixing the pre-synthesized SnSe solution and Ag2Se solution in a desired ratio. Each solution was synthesized by the well-known Alkahest solvent method. To synthesize the SnSe solution, 1.8 ml of ethylenediamine and 0.18 ml of ethanedithiol were introduced into a mixture of 90 mg Sn powder and 60 mg Se powder. After stirring at 50° C. for 1 hour, the powder was completely dissolved and the mixture became a transparent yellow solution. Further purification was performed to remove impurities from the synthesized SnSe solution. An acetonitrile antisolvent was introduced into the SnSe solution at the volume ratio of the antisolvent to the solvent to 25:1. The mixture was centrifuged at 7,500 rpm for 5 minutes to extract a precipitate, which was dispersed in ethylenediamine to form a bright yellow solution. To synthesize the $Ag_2Se$ solution, 15.6 mg of $Ag_2S$ powder and 10.0 mg of Se powder were introduced into 0.9 ml of ethylenediamine and 0.09 ml of ethanethiol, respectively, and the $Ag_2S$ solution and the Se solution were mixed at a volume ratio of 1:4. The concentration of the solution was adjusted by adding ethylenediamine and ethanethiol. Finally, the SnSe solution and the $Ag_2Se$ solution were mixed at a desired ratio to synthesize an $Ag_xSn_{1-x}Se$ precursor solution for spin coating. The precursor solution was synthesized so that x was 0, 0.005, 0.01, or 0.02. All the above processes were performed in a glove box filled with $N_2$ gas at room temperature.

<Preparation of Thermoelectric Thin Film>

The glass substrate was washed with acetone, methanol, and isopropanol, and $O_2$ plasma treatment was performed to introduce a hydrophilic group to the surface of the substrate. 40 ul of the synthesized precursor solution was deposited on the substrate which a hydrophilic group was introduced, and spin-coated at 2000 rpm for 40 s. The coated layer was dried at 80° C. for 5 minutes to remove any residual solvent, and heat-treated on a hot plate at 500° C. for 1 minute. After the heat treatment, the thin film was cooled to room temperature, and the spin coating, drying, heat treatment and cooling processes were repeated several times. All the above processes were performed in a glove box filled with $N_2$ gas at room temperature.

<Confirmation of Surface Properties of Thermoelectric Thin Film>

Figure 1B:
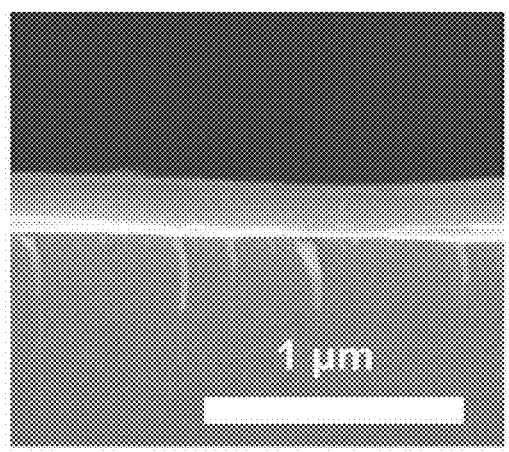
FIG. 1B is a interferometric scattering microscope photograph of the surface of the thermoelectric thin film prepared according to the present invention.
Figure 1C:
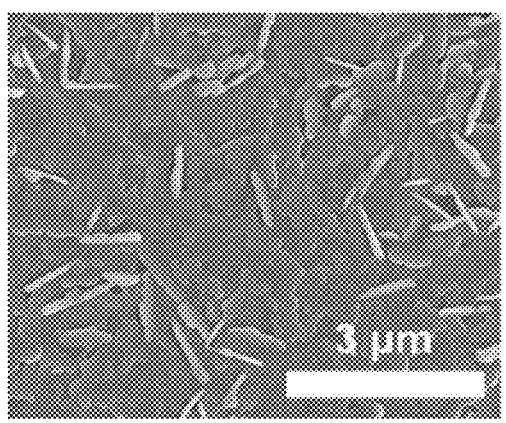
FIGS. 1C to 1F are scanning electron microscope photographs of the surface of the thermoelectric thin film prepared according to examples and comparative examples of the present invention.
Figure 1D:
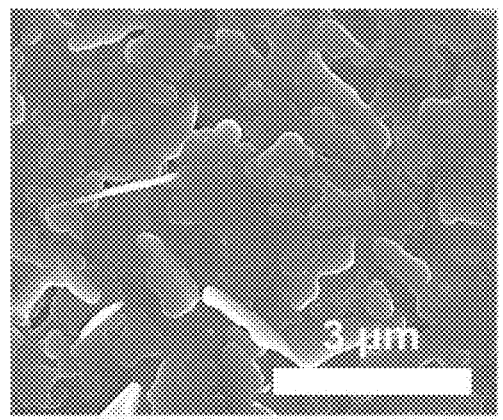
Figure 1E:
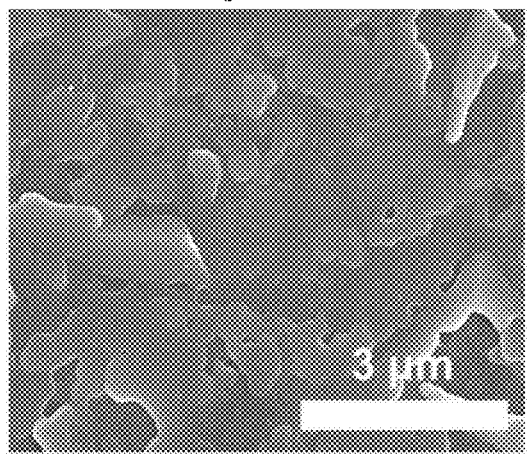
Figure 1F:
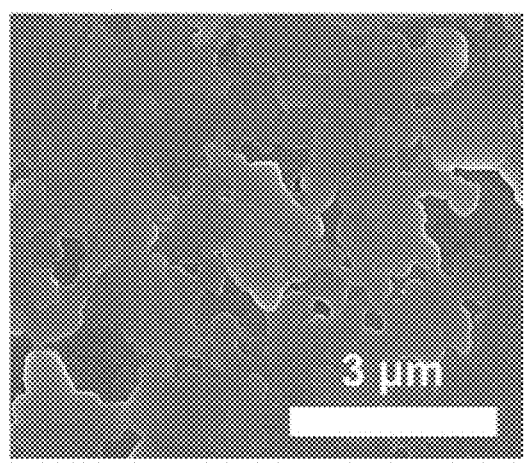
Figure 2A:
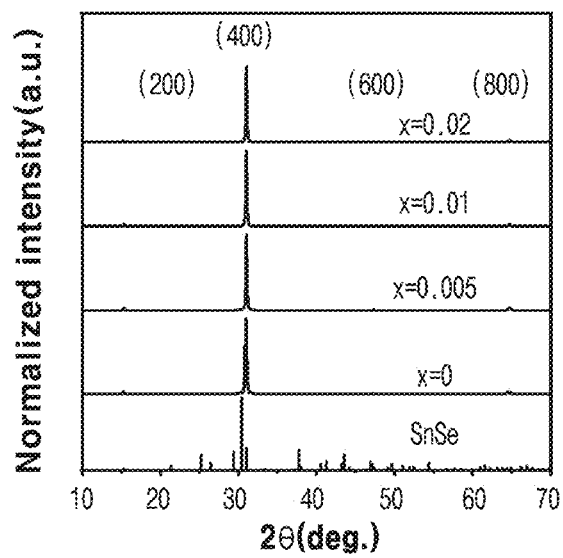
FIG. 2A is a set of X-ray diffraction pattern analysis graphs for the surface of the thermoelectric thin film prepared according to examples and comparative examples of the present invention.
Figure 2B:
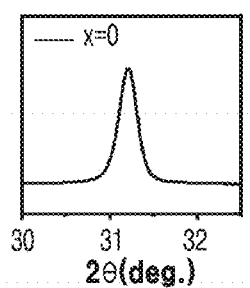
FIGS. 2B to 2E are X-ray diffraction pattern graphs showing an enlarged range of 2θ of 30 to 32 for x=0, x=0.005, x=0.01, and x=0.02, respectively, in FIG. 2A, FIGS. 3A to 3D are a set 2D GXRD pattern images of the surface of the thermoelectric thin film prepared according to examples and comparative examples of the present invention.
Figure 2C:
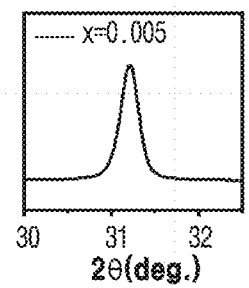
Figure 2D:
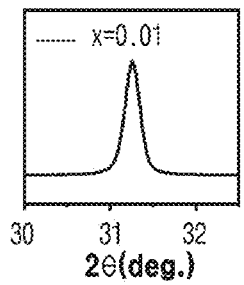
Figure 2E:
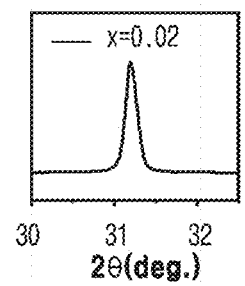
Figure 3A:
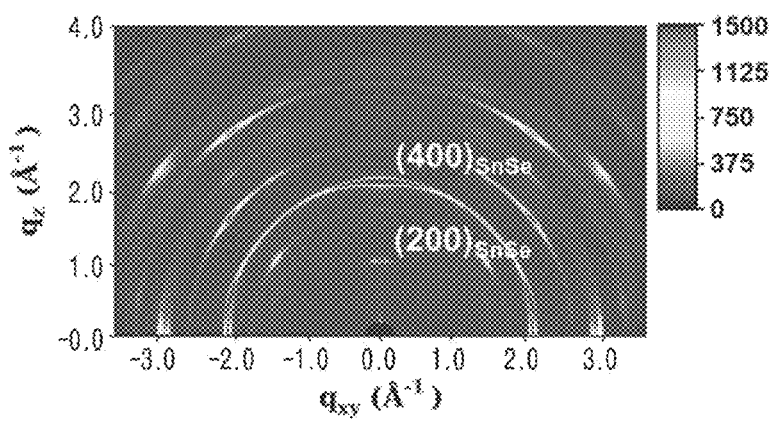
Figure 3B:
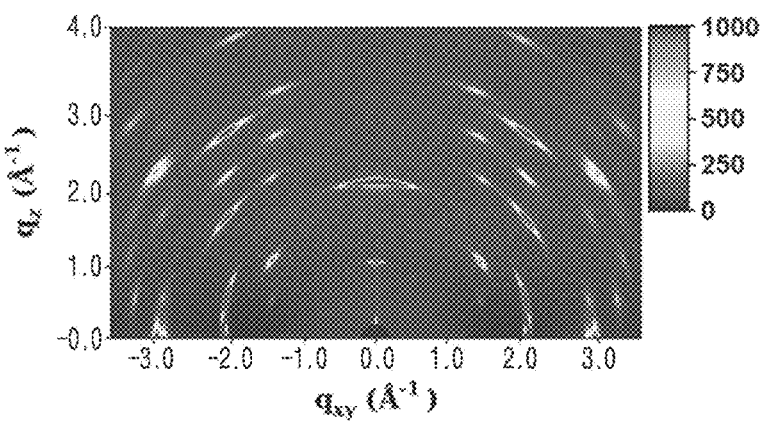
Figure 3C:
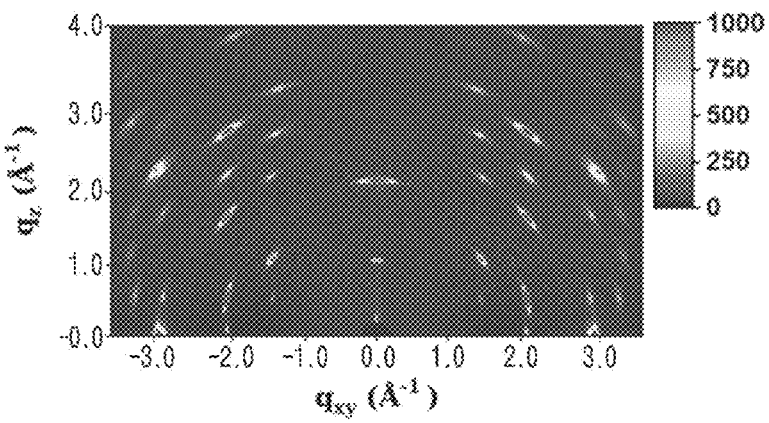
Figure 3D:
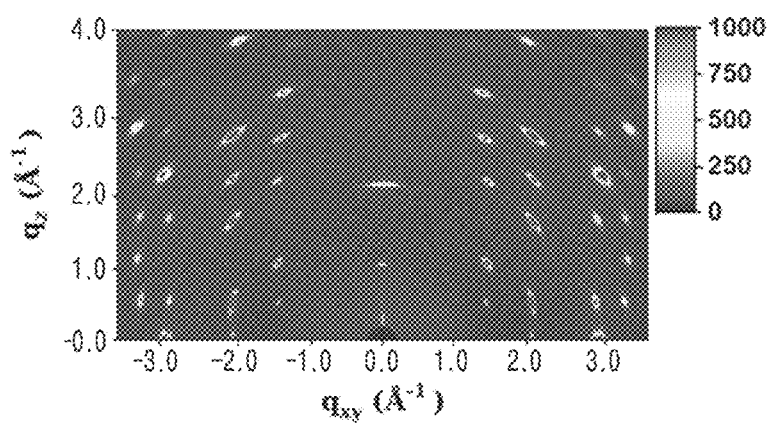
Figure 4A:
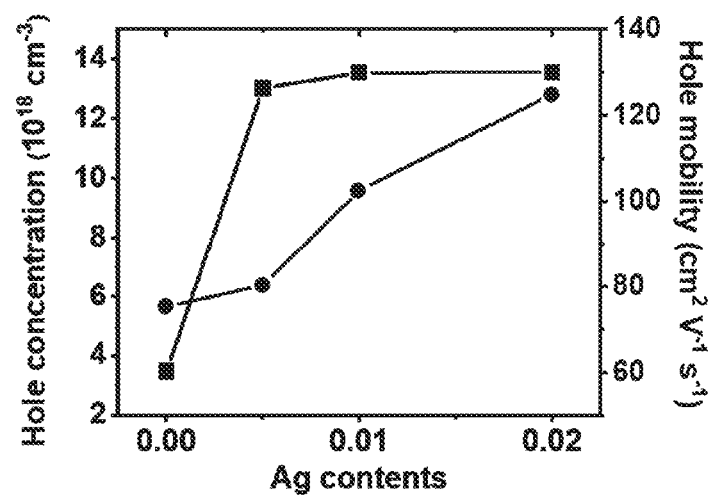
FIGS. 4A to 4F are a set of graphs showing thermoelectric characteristics of the thermoelectric thin film prepared according to examples and comparative examples of the present invention.
Figure 4B:
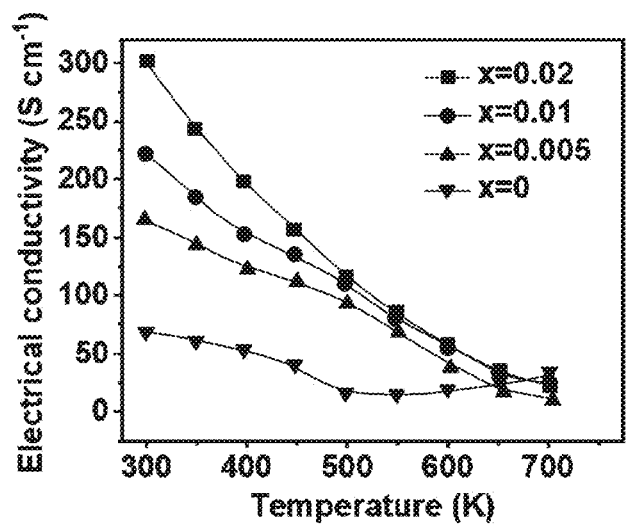
Figure 4C:
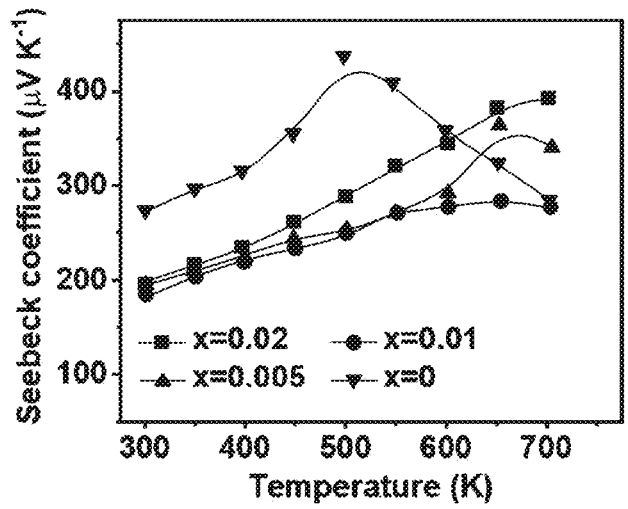
Figure 4D:
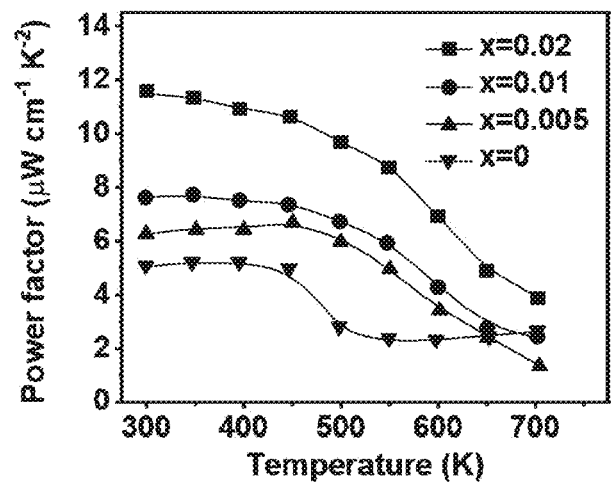
Figure 4E:
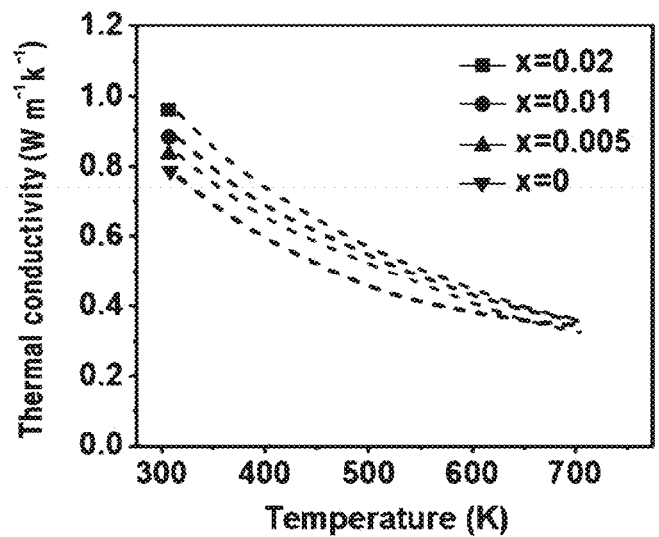
Figure 4F:
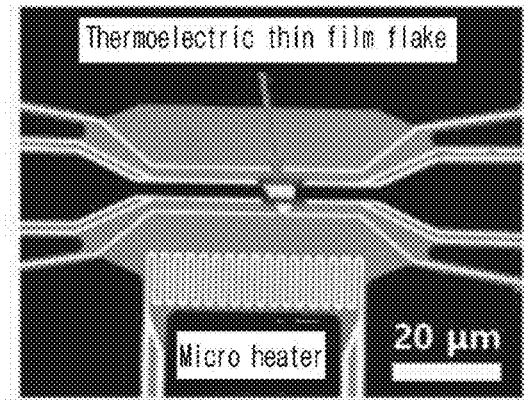

The surface properties of the prepared thermoelectric thin film were confirmed using a scanning electron microscope (SEM) and an interferometric scattering microscope, and the results are shown in FIG. 1A to 1F. As shown in FIG. 1A to 1F, it was confirmed that all the thermoelectric thin films were grown in the in-plane direction through the scanning electron microscope images (FIG. 1C (x=0), FIG. 1D (x=0.005), FIG. 1E (x=0.01), and FIG. 1F (x=0.02)), and it was confirmed that the thermoelectric thin films had a uniform thickness of about 200 nm through the interferometric scattering microscope images (FIGS. 1A and 1B). In addition, through the X-ray diffraction pattern analysis, it was confirmed that the prepared thermoelectric thin film had a complete SnSe crystal structure without impurities and was strongly oriented to the (h00) direction (FIGS. 2A to 2E). Through the 2D GXRD pattern image, it was confirmed that the orientation of the SnSe crystal was further strengthened as the thermoelectric thin film was doped with Ag (FIG. 3A (x=0), FIG. 3B (x=0.005), FIG. 3C (x=0.01), and FIG. 3D (x=0.02)).

<Confirmation of Thermoelectric Properties of Thermoelectric Thin Film>

To confirm the thermoelectric properties of the prepared thermoelectric thin film, Hall effect was measured at room temperature to evaluate the charge carrier concentration and mobility of the thermoelectric thin film, and the results are shown in FIG. 4A to 4F. The charge carrier concentration of the thermoelectric thin film was increased significantly when the doping concentration of Ag was increased from 0% to 0.5%, and through this, it was confirmed that Ag plays a role as a p-type dopant in the SnSe thermoelectric thin film. The charge carrier concentration of the thermoelectric thin film did not change much since then, even though the doping concentration of Ag was increased, which means that the maximum amount of Ag that can be doped into SnSe is about 0.5%. Meanwhile, the mobility of the thermoelectric thin film continued to increase in direct proportion to the doping concentration of Ag. The increase in mobility even though the impurity concentration inside the thermoelectric thin film increased means that Ag intercalated in SnSe was involved in the crystal growth process of SnSe and contributed to the strong orientation of the crystal. These results are consistent with the results of the X-ray analysis performed earlier.

Then, in order to confirm the electrical properties of each thermoelectric thin film, the electrical conductivity and the Seebeck coefficient according to temperature were measured. The electrical conductivity was increased significantly as Ag was doped, whereas the Seebeck coefficient did not differ significantly after the doping concentration of Ag reached 0.5%. As a result, the thermoelectric thin film with the highest Ag concentration of 2% recorded the best electrical properties.

In order to measure the thermal conductivity of the thermoelectric thin film, a process of peeling the thin film from the substrate was performed. In this case, the peeled thermoelectric thin film was transferred to an MTMP (microfabricated thermoelectric measurement platform) substrate for measuring thermal conductivity to perform the measurement. The thermal conductivity was slightly increased as the doping concentration of Ag was increased.

<Preparation of Patterned Thermoelectric Thin Film and Power Measurement>

AZ4620 photoresist was spin-coated on the prepared thermoelectric thin film, and thereafter, a pattern was formed on the thermoelectric thin film through a known photolithography process. After development, the exposed thin film was etched under $Cl_2$/Ar via reactive ion etching (RIE). The residual photoresist was removed using acetone. Through this, a thermoelectric thin film having a pattern physically separated from each other was formed. An Ag electrode was thermally deposited on the patterned thin film to electrically connect each pattern to prepare a final thermoelectric thin film. For the prepared thermoelectric thin film, a ceramic heater (70 mm×15 mm) was used as a heat source, and a copper plate was used as a heat sink to measure output power. The temperature difference and voltage were measured with a T-type thermocouple connected to a Keithley 2000 multimeter.

Figure 5A:
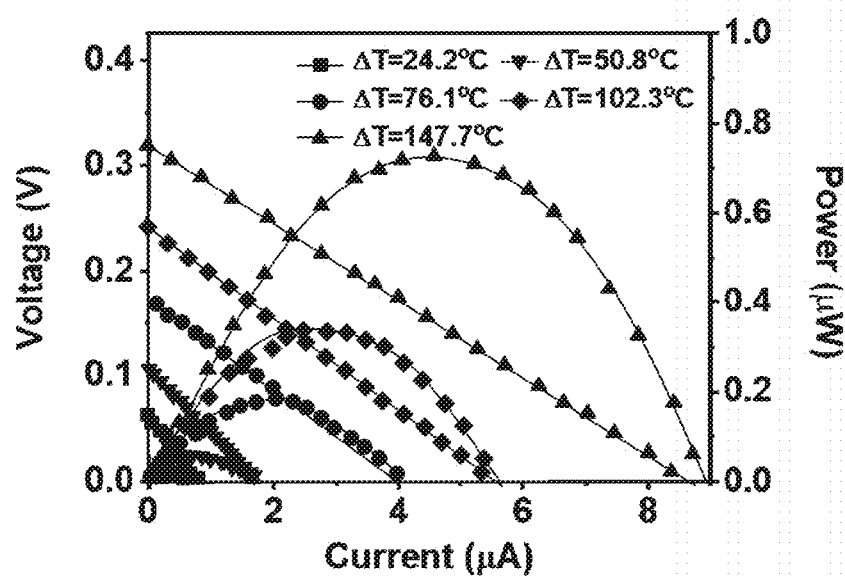
FIGS. 5A and 5B are a set of graphs showing the power generation characteristics of the thermoelectric thin film prepared according to the present invention.
Figure 5B:
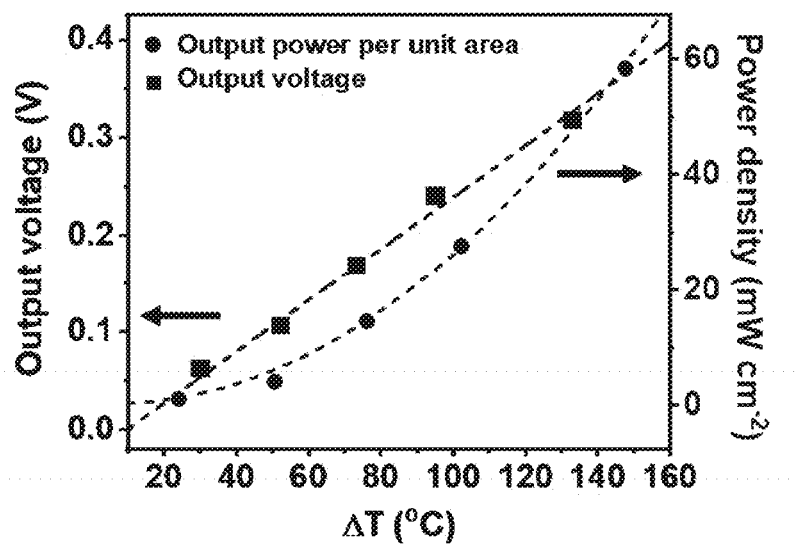

The experimental results are shown in FIGS. 5A and 5B. As shown in FIGS. 5A and 5B, it was confirmed that when the temperature difference applied in the thermoelectric generator was 147.7 Kelvin, a maximum voltage of about 0.32 V was generated and a maximum power of about 7.0 μW was generated.

<Preparation of Stretchable Thermoelectric Thin Film and Power Measurement>

Figure 6:
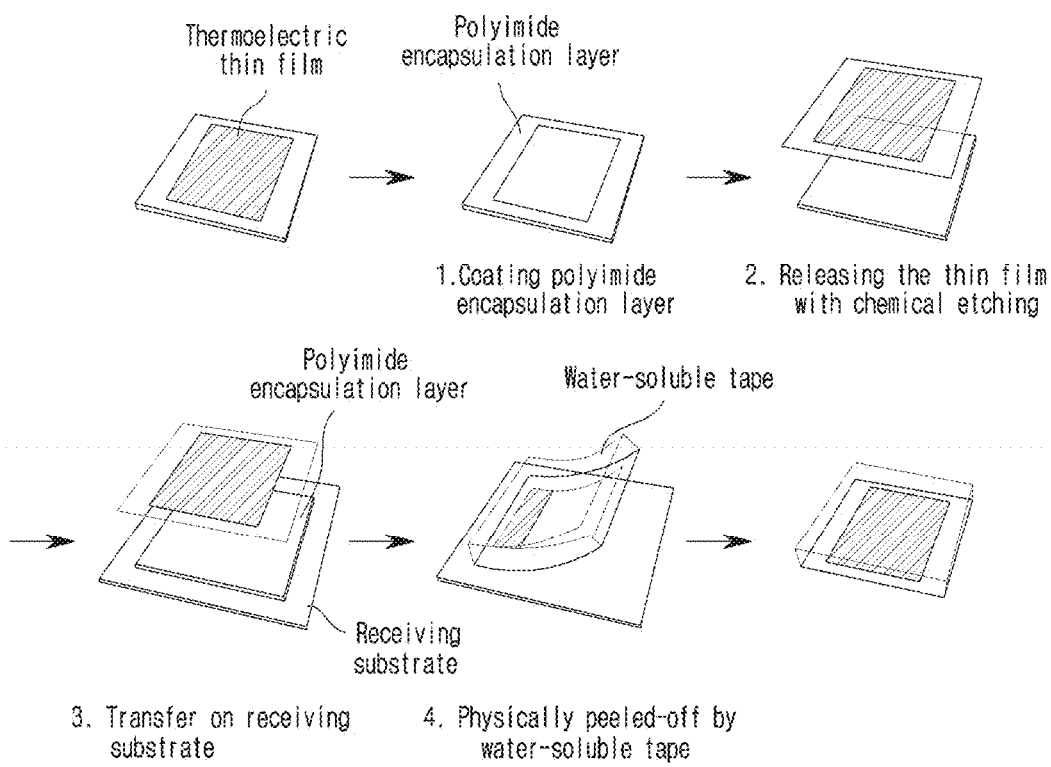
FIG. 6 is a schematic diagram showing the preparation method of the present invention.
Figure 7A:
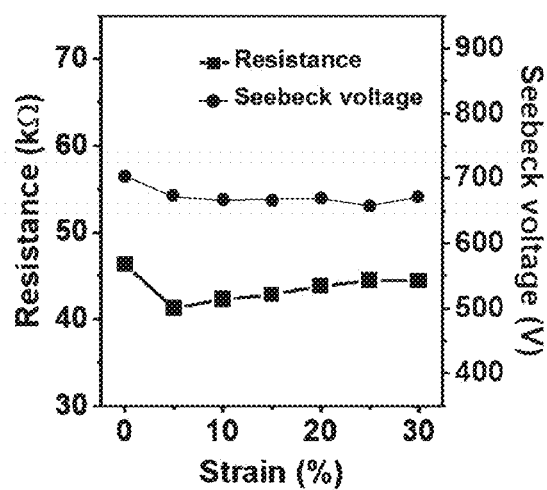
FIGS. 7A to 7D are a set of graphs showing the power generation characteristics of the thermoelectric thin film prepared by the preparation method of the present invention. Specifically.
Figure 7B:
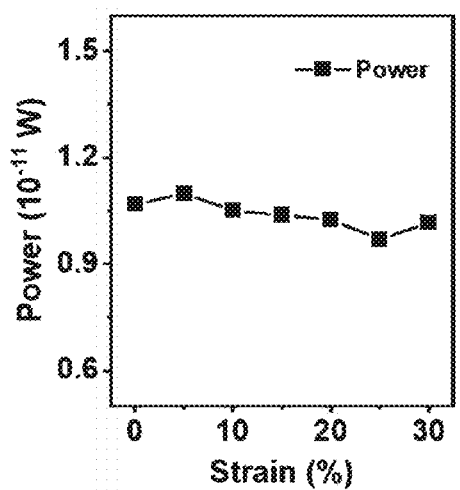
Figure 7C:
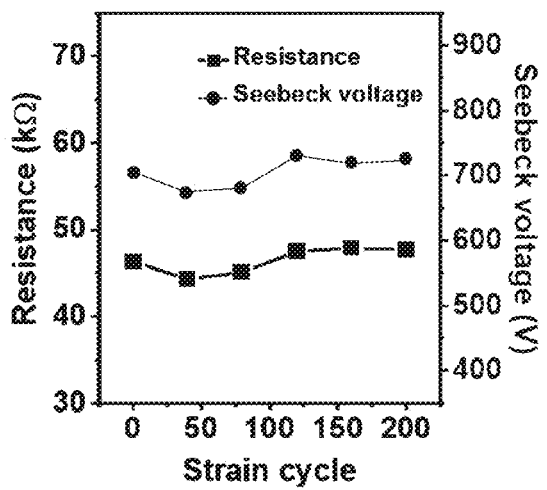
Figure 7D:
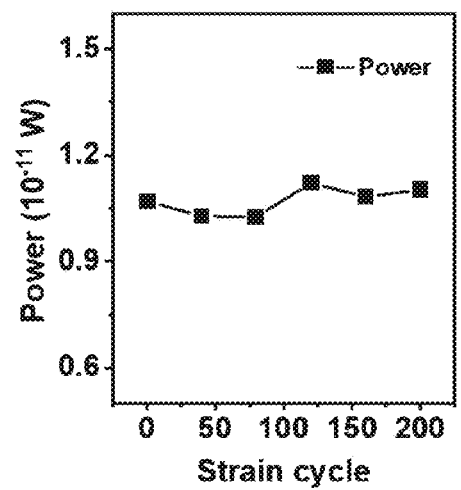

The polyimide encapsulation layer was spin-coated on the upper surface of the prepared patterned thermoelectric thin film and annealed. In order to transfer the thermoelectric thin film coated with the polyimide encapsulation layer on the upper surface to the polyimide-coated receiving substrate, a process of chemically etching the substrate was performed using Buffered Oxide Etchant (BOE), a hydrofluoric acid-based etching solution. A process of transferring the thin film completely separated from the substrate to the receiving substrate was performed. Through this, a thermoelectric thin film in which both the upper and lower surfaces are sealed with a polyimide encapsulation layer was formed on the substrate. In order to separate the encapsulated thermoelectric thin film from the receiving substrate, a process of physically peeling was performed using a water-soluble tape. The encapsulated thermoelectric thin film separated from the substrate was transferred to a pre-elongated elastic polymer substrate, and a process of removing the water-soluble tape by dissolving it with water was performed (see FIG. 6). Then, the stretching force applied for pre-elongation from the elastic polymer substrate was removed. The electrode connection hole for connecting external electrodes was etched through the RIE process, and the Ag electrode (100 nm) was thermally deposited to finally prepare a stretchable thermoelectric thin film. Power was measured using a ceramic heater (70 mm×15 mm) as a heat source, and temperature and voltage were measured with a T-type thermocouple connected to a Keithley 2000 multimeter. The results are shown in FIGS. 7A to 7D. As shown in FIG. 7A to 7D, it was confirmed that the resistance of the material did not change even when elongation of up to 30% was applied to the finally prepared stretchable thermoelectric thin film, and the Seebeck voltage value generated when a temperature difference of about 5° C. was applied did not change. In addition, as a result of evaluating the durability of the thin film while repeatedly applying an elongation of 20%, it was confirmed that the electrical properties of the thin film were maintained without changing up to 200 times. This means that the thin film transferred on the stretchable substrate has high mechanical durability.

What is claimed is:

1. A preparation method of a stretchable inorganic thermoelectric thin film comprising the following steps:
    synthesizing $Ag_xSn_{1-x}Se$ solution by a solution process where X is a decimal number greater than 0 and less than 1;
    forming a thermoelectric thin film by coating the $Ag_xSn_{1-x}Se$ solution on a substrate;
    forming a physically separated pattern on the thermoelectric thin film;
    forming a patterned thermoelectric film by electrically connecting each pattern;
    encapsulating the patterned thermoelectric thin film;
    transferring the encapsulated patterned thermoelectric thin film to an elongated stretchable substrate; and
    removing a tensile force from the elongated stretchable substrate.

2. The preparation method of the stretchable inorganic thermoelectric thin film according to claim 1, wherein the solution process for synthesizing the $Ag_xSn_{1-x}Se$ solution is performed by mixing and reacting a SnSe solution and an $Ag_2Se$ solution.

3. The preparation method of the stretchable inorganic thermoelectric thin film according to claim 1, wherein the method further includes a step of forming a hydrophilic functional group on a surface of the substrate before coating the $Ag_xSn_{1-x}Se$ solution on the substrate.

4. The preparation method of the stretchable inorganic thermoelectric thin film according to claim 3, wherein the step of forming the hydrophilic functional group includes a step of washing the substrate and performing $O_2$ plasma treatment.

5. The preparation method of the stretchable inorganic thermoelectric thin film according to claim 1, wherein the step of forming the thermoelectric thin film by coating the $Ag_xSn_{1-x}Se$ solution on the substrate is performed by spin-coating the $Ag_xSn_{1-x}Se$ solution on the substrate and then heating the substrate.

6. The preparation method of the stretchable inorganic thermoelectric thin film according to claim 1, wherein the step of forming a physically separated pattern on the thermoelectric thin film includes the following steps:
    spin-coating a photoresist on the thermoelectric thin film;
    forming the physically separated pattern by exposing the photoresist to patterned ultraviolet light;
    performing etching on an exposed thin film surface; and
    removing the remaining photoresist.

7. The preparation method of the stretchable inorganic thermoelectric thin film according to claim 1, wherein the step of forming the patterned thermoelectric thin film by electrically connecting each pattern is performed by depositing Ag electrodes and electrically each pattern.

8. The preparation method of the stretchable inorganic thermoelectric thin film according to claim 1, wherein the step of encapsulating the patterned thermoelectric thin film is performed including the following steps:
    coating an upper surface of the patterned thermoelectric thin film with a polymer for encapsulation;
    separating the patterned thermoelectric thin film coated with the polymer for encapsulation from the substrate;
    transferring the patterned thermoelectric thin film to the substrate coated with the polymer for encapsulation, so that the polymer for encapsulation encapsulating polymer-coated, surface of the polymer for encapsulation of the substrate is in contact with a lower surface of the separated patterned thermoelectric thin film; and
    removing the patterned thermoelectric thin film in which the upper and lower surfaces are encapsulated from the substrate.

9. The preparation method of the stretchable inorganic thermoelectric thin film according to claim 8, wherein the polymer for encapsulation is polyimide.

10. The preparation method of the stretchable inorganic thermoelectric thin film according to claim 8, wherein the step of removing the patterned thermoelectric thin film in which the upper and lower surfaces are encapsulated from the substrate is performed by attaching a water-soluble tape to the surface of the polymer for encapsulation of on the upper surface side of the encapsulated patterned thermoelectric thin film, and separating the encapsulated patterned thermoelectric thin film from the substrate by applying force.

* * * * *